United States Patent
Lindemann et al.

(10) Patent No.: US 6,529,710 B1
(45) Date of Patent: Mar. 4, 2003

(54) RADIO FREQUENCY (RF) SYSTEM LOSS COMPENSATION METHOD

(75) Inventors: Brian Lindemann, Olathe, KS (US); James Joyce, Olathe, KS (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/470,636

(22) Filed: Dec. 22, 1999

Related U.S. Application Data

(60) Provisional application No. 60/113,758, filed on Dec. 23, 1998.

(51) Int. Cl.[7] .............................. H04B 1/00; H04B 7/00
(52) U.S. Cl. ........................ 455/69; 455/75; 455/126; 455/522
(58) Field of Search ........................... 455/69, 75, 115, 455/123, 126, 127, 522, 13.4

(56) References Cited

U.S. PATENT DOCUMENTS

| | | | | |
|---|---|---|---|---|
| 4,697,187 A | * | 9/1987 | Ohno et al. ................. | 342/353 |
| 5,128,629 A | * | 7/1992 | Trinh ......................... | 330/129 |
| 5,832,373 A | * | 11/1998 | Nakanishi et al. .......... | 455/126 |
| 5,937,336 A | * | 8/1999 | Kumagai ..................... | 455/126 |
| 5,991,279 A | * | 11/1999 | Haugli et al. ............... | 340/7.34 |
| 6,038,428 A | * | 3/2000 | Mizusawa et al. .......... | 330/129 |
| 6,115,587 A | * | 9/2000 | Kim ............................ | 330/129 |
| 6,188,732 B1 | * | 2/2001 | Rha ............................ | 330/149 |
| 6,236,863 B1 | * | 5/2001 | Waldroup et al. ........... | 455/126 |
| 6,253,092 B1 | * | 6/2001 | Nguyen et al. ............. | 455/126 |

* cited by examiner

*Primary Examiner*—William Trost
*Assistant Examiner*—Simon Nguyen
(74) *Attorney, Agent, or Firm*—Honeywell International Inc

(57) ABSTRACT

A closed loop automatic gain compensation method and circuit for a radio transmission and reception system formed of a radio frequency transmitter coupled through a high power amplifier to a radio frequency antenna to transmit a radio frequency transmission signal, the automatic gain compensation circuit utilizing the preexisting radio system cabling.

28 Claims, 3 Drawing Sheets

RADIO FREQUENCY (RF) SYSTEM LOSS COMPENSATION METHOD

This application claims the benefit of U.S. Provisional Application Ser. No. 60/113,758, filed in the names of Brian Lindemann and James Joyce on Dec. 23, 1998, the complete disclosure of which is incorporated herein by reference.

FIELD OF THE INVENTION

Compensation of radio system RF losses, and in particular compensation of radio system RF losses using closed loop gain compensation.

BACKGROUND OF THE INVENTION

In radio installations generally, the amount of radio frequency (RF) energy transmitted at the antenna is desirably held consistent from one installation to another. However, many sources of variation in each device result in significant variations. In ground-based single channel communication, the satellite accounts for variations by transmitting command signals to the ground-based unit to increase or decrease power output during transmission. Multichannel communication system installations for use in mass transportation vehicles, such as commercial air transport aircraft, are more complex.

Multichannel communication systems accept data and voice from various sources onboard a vehicle, encode and modulate this information to appropriate RF carrier frequencies, and transmit these carriers over any of multiple transmission channels to the satellite constellation for relay to the ground. Multichannel satellite communication (SatCom) systems also receive RF signals from the satellite constellation, demodulate these signals, perform the necessary decoding of the encoded messages, and output data or voice for use onboard the vehicle by crew members and passengers. Transceivers in such multichannel mobile satellite communication systems include a main system CPU for performing the actual transmit and receive functions, a radio control subsystem that allocates transmission channels to calls, a high power amplifier for boosting the channel power, a common antenna receiving and transmitting signals, and a low noise amplifier amplifying the RF signal received from a satellite. In multichannel mobile communication systems, such as an aircraft installation, many sources of variation in each installation result in significant installation-to-installation variations. For example, typical aeronautical SatCom system installations divide the system functions into multiple separate modules, including a telecommunications module housing the main system CPU and the radio control subsystem, a high power amplifier module, a low noise amplifier module, and the antenna. One important source of variation is inconsistencies in the equipment manufacture. Another important source of variation is the use of different types and lengths of wiring, usually coaxial cable, to interconnect the various physically separated modules, or components, of the communication unit. Although the various functional modules are interconnected with standardized wires or cables for inter-module control and to connect RF signals, installation-to-installation cable type and length variations produce variations in the amount of RF energy at the antenna.

While the desirability of holding the amount of RF energy transmitted at the antenna consistent from one aircraft installation to another is recognized, the necessary use of different types and lengths of cable in different aircraft installations is overcome only by a universal standard cable type and length. Such a standard cable is necessarily the cable required for the most demanding application. Thus, installation-to-installation consistency would require every aircraft to carry the longest, heaviest coupling cables. However, in aircraft installations, the addition of excess cable length and weight is not desirable. Furthermore, a universal type of cable may not satisfy the requirements of all radio installations. Therefore, the variations must be compensated in another way.

The satellite attempts to account for these and other variations by transmitting command signals to the communication unit to increase or decrease power output during transmission. In multichannel aircraft installations, the radio control subsystem of the communication unit dynamically controls the output power for each radio transmission channel. The typical communication unit uses closed loop power control algorithms, such as an automatic gain control circuit, for controlling RF power levels at the antenna. The transmitter communication unit receives transmit power level commands from the network satellite, which are intended to control the amount of power radiated by the antenna. The automatic gain control circuit causes the radio control subsystem to increase or decrease power output on each active radio transmission channel in response to command signals transmitted from the satellite. However, the changes in output power applied by the radio control subsystem are not translated consistently into output power at the antenna because the differing amounts of power absorption by the RF cables interconnecting the various modules results in variations in the coupling losses between the radio control subsystem and the antenna which cannot be compensated by the automatic gain control circuit. Such losses may range anywhere from 0 to 20 dB or more, depending on the installation.

Thus, even with standardized intermodule wiring, each installation results in different amount of cable loss relative to other similarly wired installations. This variation in RF cable loss presents problems with the closed loop power control algorithms of many second generation satellite systems. The installation-to-installation differences in the amount of RF cable loss causes variations in the amount of RF energy at the antenna. Thus, these installation-to-installation variations in cable loss produce variations in the amount of power radiated by the antenna.

Manual control of the radiated power variations are impractical. For example, attempting to reduce the installation-to-installation variation by tightly controlling the cable types and cable lengths results in a significantly more difficult installation. Manually measuring power levels and manually adjusting the gain of the high power amplifier until a specified power level is measured also results in a significantly more difficult installation.

Furthermore, in installations where standard cabling is provided, adding a cable for a new purpose, such as determining the output power at the antenna relative to the output power at the transmission channel, is not an practical option. Therefore, the detection and communication of system losses must utilize existing cables. One attempt to resolve the coupling losses between the radio control subsystem and the antenna added a DC bias on the return cable from the antenna to the radio control subsystem. However, the DC bias is subject to the same cable losses as the original signal.

Therefore, what is needed is a means for accurately determining the output power at the antenna relative to the output power at the transmission channel without additional cabling.

SUMMARY OF THE INVENTION

The present invention overcomes the limitations of the prior art by providing a method and circuit for automatically compensating the installation-to-installation cable loss variation without manual intervention, thereby providing easier and less expensive radio installations. Furthermore, the method and circuit of the present invention continually compensates the radio system power level variations, resulting in a radio system that is robust to radio system variations, such as variations in gain of the radio system high power amplifier due to manufacturing variations, temperature fluctuations, and other factors affecting cable loss.

The method and circuit of the present invention provide means for dynamically adjusting the output power at the antenna of a radio system by determining the power level difference between the signal source and the system antenna, and dynamically adjusting the system gain in response to the detected power level difference.

In any radio installation wherein system RF losses can be compensated by adjusting the gain, the present invention provides a closed loop gain compensation method utilizing preexisting cabling within the radio system.

The present invention overcomes the gain compensation limitations in radio transmission and reception systems of the prior art by providing an automatic gain compensation circuit for a radio transmission and reception system formed of a circuit coupled to receive a transmission signal generated by a radio system transmitter, the circuit generating an output power signal, which is representative of the transmission signal output power, and transmitting the signal on the radio system's receiver line. The automatic gain compensation circuit of the invention also includes a power control circuit coupled to receive the output power signal, which generates a power control signal in response to the output power signal and communicates the power control signal to the radio system signal amplifier using the existing transmission and reception lines, i.e., without change to the existing installation. Preferably, the output power signal is either a sinusoidal signal proportional to the radio system's transmission signal output power, or a frequency modulated signal with digital information representative of the transmission signal output power contained in the modulation. The transmission signal generated by a radio system received by the circuit is preferably representative of the radio system output power at the radio system's antenna.

According to one aspect of the invention, the power control signal generated by the circuit is a digital signal transmitted at a frequency different from the radio system transmission signal frequency. For example, in a radio system transmitting in the L-band, the digital signal generated by the circuit is modulated in the frequency range of about 1 kHz to 5 kHz. Alternatively, the power control signal generated by the circuit is a sinusoidal signal having a frequency range of about 1 kHz to 5 kHz.

According to another aspect of the invention, the gain compensation circuit includes a RF power level detector coupled to detect the power level in the RF signal generated by a radio system and generates a voltage signal proportional to the transmission signal output power. A converter coupled to receive said voltage signal converts the voltage signal into a frequency signal representative of the output voltage signal. A signal summer coupled to receive both the representative frequency signal and a RF signal received by the radio system combines both signals into a single combined signal for transmission on the radio system receiver cable to a signal splitter. The signal splitter splits the signals and outputs both the representative frequency signal and the received RF signal as separate outputs. A power controller coupled to receive the representative frequency signal from the signal splitter generates a power control signal and outputs the power control signal to the radio system's signal amplifier.

According to other aspects of the invention, the invention overcomes the limitations of the prior art by providing a method implemented in the automatic gain compensation circuit of the invention, the method including automatically determining the RF power losses of a radio frequency transmission system; communicating the losses to the portion of the radio frequency transmission system originating the radio frequency transmission using preexisting cabling within the radio transmission system; and controlling the RF power gains to compensate for the losses. The method preferably includes detecting a RF power level of the radio frequency transmission; generating a signal indicative of the RF power level of the radio frequency transmission; and transmitting the indication signal to the portion of the radio transmission system originating the radio frequency transmission using preexisting cabling within the radio transmission system. Transmitting the indication signal includes combining the indication signal with a RF signal originating externally to the radio transmission system and received thereby, and transmitting the two signals together on the radio system's receiver cable.

According to one aspect of the method of the invention, the method also includes generating a power control signal and communicating the power control signal to the portion of the radio frequency transmission system controlling RF power gains of the radio frequency transmission to control the RF power gains to compensate for losses in the radio system.

According to another aspect of the invention, the automatic gain compensation circuit of the invention is implemented in a radio transmission and reception system having a transmitter generating a RF signal and a high power amplifier coupled to the transmitter by a first transmitter cable, the high power amplifier dynamically increasing and decreasing the power of the RF signal in response to the power control signal. The amplified RF signal is output via a second transmit cable to the circuit of the invention coupled to receive the transmission signal generated by the radio system, the circuit including a diplexer that detects the power level of the internally generated RF signal.

According to another aspect of the invention, a radio system RF antenna is coupled to the diplexer by a receiver/transmitter cable to receive the internally generated RF signal and transmit a RF transmission signal representative thereof. The antenna also receives a RF signal originating outside of the radio system, for example, by a satellite, and outputs the received RF signal. Preferably, a low noise amplifier is coupled to the antenna by the receiver/transmitter cable to receive the antenna output, i.e., the received RF signal. The low noise amplifier amplifies the received RF signal as required by the radio system.

According to another aspect of the invention, a signal summer is coupled to the diplexer to receive the output power signal and is also coupled to the low noise amplifier to receive the received RF signal. The signal summer sums the two signals into a single combined signal and outputs the combined signal on the radio system's receiver line.

According to still another aspect of the invention, the power control circuit includes a signal splitter coupled to the radio system's receiver line to receive the combined signal.

The signal splitter divides the combined signal into its component parts: the representative output power signal and the received RF signal. The power control circuit also includes a power control signal generator coupled to receive the representative output power signal from the signal splitter and generate a variable power control signal responsive to the output power signal. The power control signal generator is coupled to communicate the variable power control signal to the high power amplifier. In a preferred radio system, a receiver is coupled to the signal splitter for receiving the received RF signal.

According to other aspects of the invention, the invention provides the method for automatic gain compensation in a radio system wherein the automatic gain compensation function utilizes the cabling preexisting within the radio system.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF PREFERRED EMBODIMENT

In the Figures, like numerals indicate like elements.

The present invention is a unique feedback method and circuit that allows a radio system transmitting and receiving signals to dynamically and accurately increase and decrease output power. The method and circuit of the invention provide means for measuring the radio frequency (RF) transmission power at the radio system antenna, comparing the antenna power level to the source power level, and dynamically adjusting the system gain to null the net effects of system losses. Accordingly, the invention provides an automatic gain compensation method and circuit for dynamically controlling the gain between a radio system transmitter and antenna using the system RF signal receive and transmit cables to transmit the gain compensation signals by generating gain compensation signals that are sufficiently different in frequency from the transmitted and received RF signals that the gain compensation signals are combined with the transmitted and received RF signals without affecting the transmitted or received RF signals.

The method of the invention includes dynamically determining an RF power level at the system antenna and generating a signal indicative of that antenna RF power level. The antenna power level signal is combined with a received RF signal and transmitted via the system receiver cable to the signal source. The antenna power level signal is of a form such that it does not affect the RF signal received at the system antenna. At the system receiver the received RF transmission signal and the antenna power level signal are split. The received RF transmission signal is applied to the system receiver. The power level signal is compared to the transmitter output power and used to generate a power adjust signal that is transmitted to the system power amplifier via the radio system transmission cable. The power adjust signal is of a form such that it does not affect the RF transmission signal. The power adjust signal dynamically adjusts the antenna power upwardly or downwardly, thereby dynamically adjusting the output power at the radio system antenna using the existing radio system cabling without adversely affecting either transmitted or received RF signals.

An illustrative embodiment of the automatic gain compensation method and circuit of the invention is described herein in terms of a satellite communications system capable of dynamically adjusting the system output power at the antenna responsively to a power adjust signal. The radio thereby automatically compensates for installation dependent cable loss variations. The embodiment illustrated is not intended to in any way limit the scope of the invention. Those of ordinary skill in the art will recognize that dynamic power adjustment method and circuit of the invention may be practiced with other radio systems than those described in the illustration.

Figure 1:
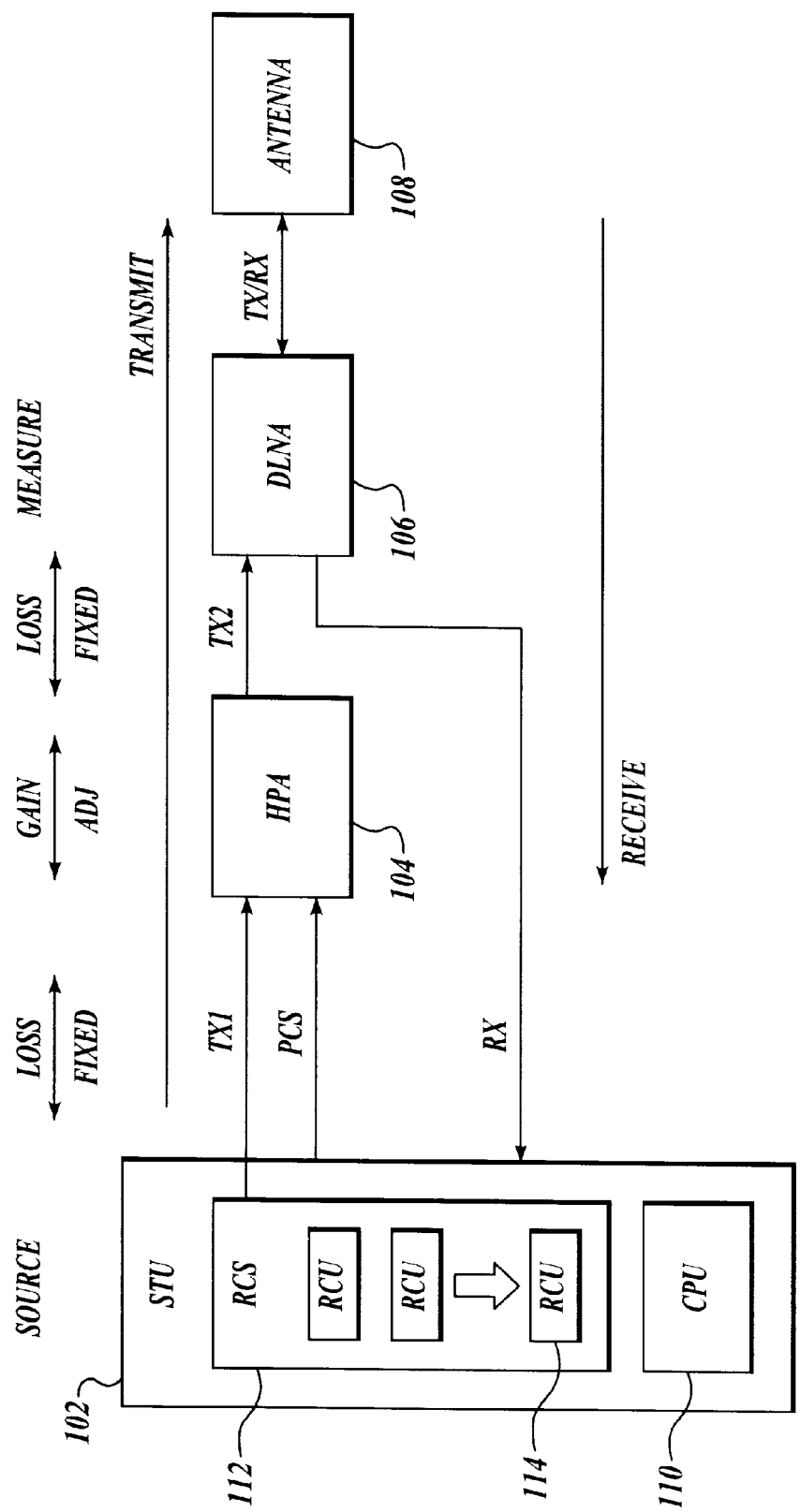
FIG. 1 illustrates a block diagram of the avionics forming a specific implementation of the multichannel communication systems equipment of a satellite communication system (SatCom) operating in the L-Band frequency range, for use in mass transportation vehicles, such as commercial air transport aircraft.

FIG. 1 illustrates a block diagram of the avionics forming a specific implementation of the multichannel mobile communication systems equipment 100 of a satellite communication system operating in the L-Band frequency range, for use in mass transportation vehicles, such as commercial air transport aircraft. Airborne SatCom equipment 100 accepts data and voice input from various sources (not shown) onboard the aircraft, encodes and modulates this information to appropriate RF carrier frequencies, and transmits these RF signals to the satellite constellation for relay to the ground. Avionics equipment 100 also receives RF signals from the satellite constellation, demodulates these RF signals, performs the necessary decoding of the encoded messages, and outputs data or voice for use on-board the vehicle by crew members and passengers.

In FIG. 1, the avionics forming the satellite equipment 100 include, for example, a satellite telecommunications unit (STU) 102, which is essentially a mobile switch, allowing several users, including passengers, flight crew and automated avionics systems, to share the multiple cellular-to-satellite transmission channels. Satellite equipment 100 also includes a high power amplifier (HPA) 104, a diplexer low noise amplifier (DLNA) 106, and a low gain antenna 108. Satellite telecommunications unit 102 includes a main system central processing unit (CPU) 110, which performs the actual transmit power control calculations. Central processing unit 110 is coupled to a radio control subsystem (RCS 112) that allocates the multiple radio channel units (RCU) 114 to incoming and outgoing calls. Radio channel units 114 are modular radio units which handle all the signaling on the L-Band radio frequency link, including for example such standard telephone capabilities as voice mail, call forwarding and worldwide messaging, PC modem data, packet data, and facsimile transmissions. Radio control subsystem 112 is coupled using a length of coaxial cable to separately located high power amplifier 104 for transmitting and receiving communication signals. High power amplifier 104 receives and amplifies the combined transmitter output power of all active radio channel units 110 and transmits the amplified signals to antenna 108 for transmission to a satellite network for communication.

The transmission cable (TX1) coupling radio control subsystem 112 to high power amplifier 104 is of a fixed type and length for any specific aircraft type original equipment manufacturer (OEM) installation, but varies in type and length for installation in different aircraft types and retrofits. Therefore, the power loss over transmission cable TX1 is fixed for a specific installation by its fixed type and length, but the power loss varies from installation-to-installation as the type and length of transmission line TX1 vary. The output of high power amplifier 104 is coupled through diplexer low noise amplifier 106 to antenna 108. The transmission cable (TX2) coupling high power amplifier 104 to diplexer low noise amplifier 106 is also of a fixed type and length for any specific aircraft type OEM installation, but also varies in type and length for installation in different aircraft types and retrofits. Therefore, the power loss over transmission cable TX2 is also fixed for a specific installation by its fixed type and length, but varies from installation-to-installation as the type and length of transmission line TX2 vary. Such losses may range anywhere from 0 to 20 dB or more, depending on the installation.

Diplexer low noise amplifier 106 is coupled to antenna 108 by transmission cable TX/RX, which is essentially constant in type and length from one installation to another such that the power losses over transmission cable TX/RX are essentially fixed from one installation to another. Furthermore, the nature of transmission cable TX/RX is such that the cable loss between diplexer low noise amplifier 106 and antenna 108 is only on the order of 3/10 dB, which is relatively insignificant in comparison to the above described potential cable loss on TX1 and TX2 between radio control subsystem 112 and antenna 108. Diplexer low noise amplifier 106 amplifies the RF signal received from a satellite and transmits the amplified RF signal to satellite telecommunications unit 102. A cavity filter (shown in FIG. 2) includes a circuit that protects sensitive diplexer low noise amplifier 106 from damage during system RF transmissions.

Diplexer low noise amplifier 106 is coupled to radio control subsystem 112 via transmission cable RX, whereby RF transmissions received from the satellite network are received at any of multiple radio channel units 114. According to the invention, the amplified receive RF signal transmitted on transmission cable RX from diplexer low noise amplifier 106 to central processing unit 110 also contains a signal indicative of the actual power at antenna 108. Radio control subsystem 112 responsively generates a power control signal that is transmitted to high power amplifier 104, preferably via transmission cable TX1. In response to the received power control signal, high power amplifier 104 dynamically adjusts the channel power, or gain, on transmission line TX2 for transmission to antenna 108, thereby nulling the variation between the output power at radio control subsystem 112 and the output power at antenna 108. Therefore, the communication unit is able to effectively respond to satellite command signals to increase or decrease power output during transmission.

The present invention is most effectively implemented in a configuration having means to detect the RF power level at the system antenna and compare the detected antenna RF power level with the RF power level at the signal source. Generally, the measure of RF power at the diplexer low noise amplifier 106 accurately indicates the actual RF power at the system antenna, i.e., low gain antenna 108. The cable type and length between diplexer low noise amplifier 106 and low gain antenna 108 is essentially consistent from installation-to-installation, and losses in the cable are relatively insignificant, as described above. Therefore, a measurement of the RF power at diplexer low noise amplifier 106 provides a highly repeatable measure of the RF power at low gain antenna 108. Furthermore, the power loss between diplexer low noise amplifier 106 and low gain antenna 108 is relatively constant and is accounted for using a constant power offset.

Figure 2:
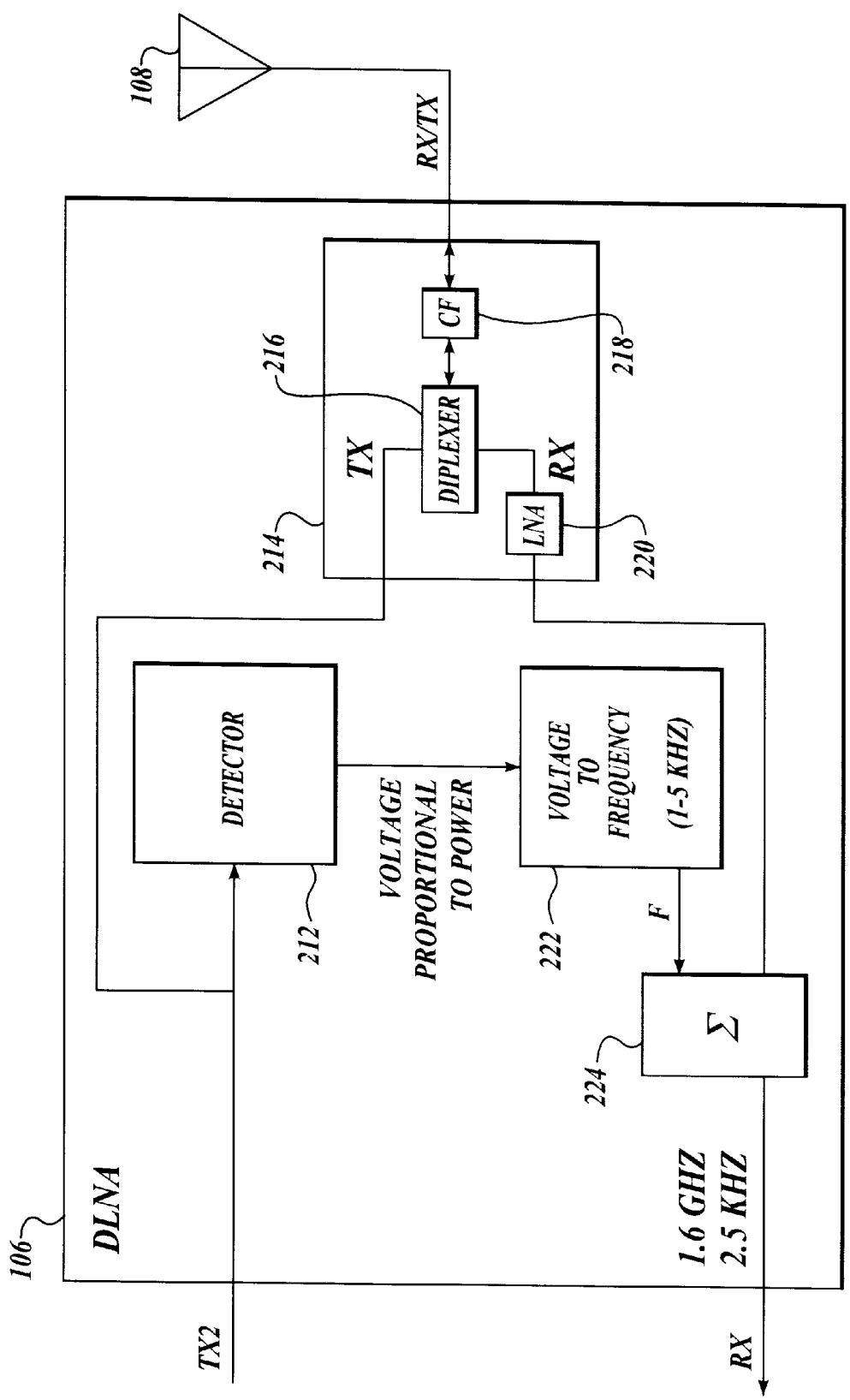
FIG. 2 is a block diagram of diplexer low noise amplifier and antenna, including the RF power level detector of the invention, for receiving the RF transmission signal from a transmitter via a transmission cable, which is usually a coaxial cable.

FIG. 2 is a block diagram of diplexer low noise amplifier 106, including the RF power level detector of the invention. In FIG. 2, diplexer low noise amplifier 106 receives a RF transmission signal from high power amplifier 104 via transmission cable TX2, which is preferably a coaxial cable. The RF transmission signal is applied to a detector 212 for detecting the RF power level of the signal. Detector circuit 212 detects the RF signal power level and generates a voltage "Vout" that corresponds directly to the detected signal power level. Detector 212 is any known RF power level detector. For example, detector 212 may be a 20 dB directional coupler with a detector providing a signal representative of the radio system output voltage Vout at the coupler in proportion to the RF output power "Pout" passing through the coupler, or:

Vout Pout.

The RF transmission signal is simultaneously applied to a diplexer/filter circuit 214 for transmission to system antenna 108. Diplexer/filter circuit 214 typically includes diplexer 216, a cavity filter circuit 218 that isolates the transmit path from the receive path during the transmit mode to prevent damage to sensitive diplexer low noise amplifier 106, and a low noise amplifier circuit 220. The detector signal from detector 212 is applied to a converter 222, which converts the detector signal into a frequency signal "F."

The frequency of frequency signal F has a direct correlation to output voltage Vout as output voltage Vout has a direct correlation to the detected power level. Therefore, the frequency of frequency signal F is directly correlated to the RF power level detected at diplexer low noise amplifier 106. As the output voltage Vout of detector 212 varies, converter 222 varies frequency signal F to represent Vout of detector 212. Frequency signal F is thereby used to communicate the transmit signal power level entering diplexer low noise amplifier 106 from high power amplifier 104 to satellite telecommunication unit 102. Frequency signal F is varied in such a way that the cable losses from the diplexer low noise amplifier 106 to satellite telecommunication unit 102 do not contribute to ambiguous decoding of the transmit level.

Frequency signal F is provided either as an analog or a digital representation of the output voltage Vout of detector 212. According to one embodiment of the invention, frequency signal F is a sinusoidal signal with a frequency proportional to the magnitude of output voltage "Vout" of detector 212, or:

F Vout.

That is, the frequency of signal F changes as the voltage from the detector 212 changes, such that decoding the frequency of signal F provides the actual output voltage from detector 212. Preferably, frequency signal F is implemented as a sine wave having a frequency range far removed from the operating frequency of the radio system. For example, in a satellite communications system implementation of the present invention, the received RF signal is in the L-Band, or 1.6 GHz frequency range, while proportional frequency signal F is preferably in the range of about 1 to 5 kHz.

In another embodiment of the invention, the output voltage "Vout" from detector 212 is converted to a digital representation, and frequency signal F is a frequency modulated signal with the digital information contained in the modulation. The modulation of frequency signal F is decoded, and the actual value of the voltage at detector 212 is computed.

Frequency signal F and a RF signal received from the satellite constellation are summed in a summing circuit 224 and transmitted to the radio system RF transmission signal source on single coaxial receiver cable (RX). At the radio system signal source, frequency signal F and the RF signal received from the satellite constellation are split. The received RF signal is applied to the radio system receiver. The frequency signal F is used to generate a power control signal, which is applied to the system power amplifier to dynamically adjust the transmission power in response to the applied power control signal.

Figure 3:
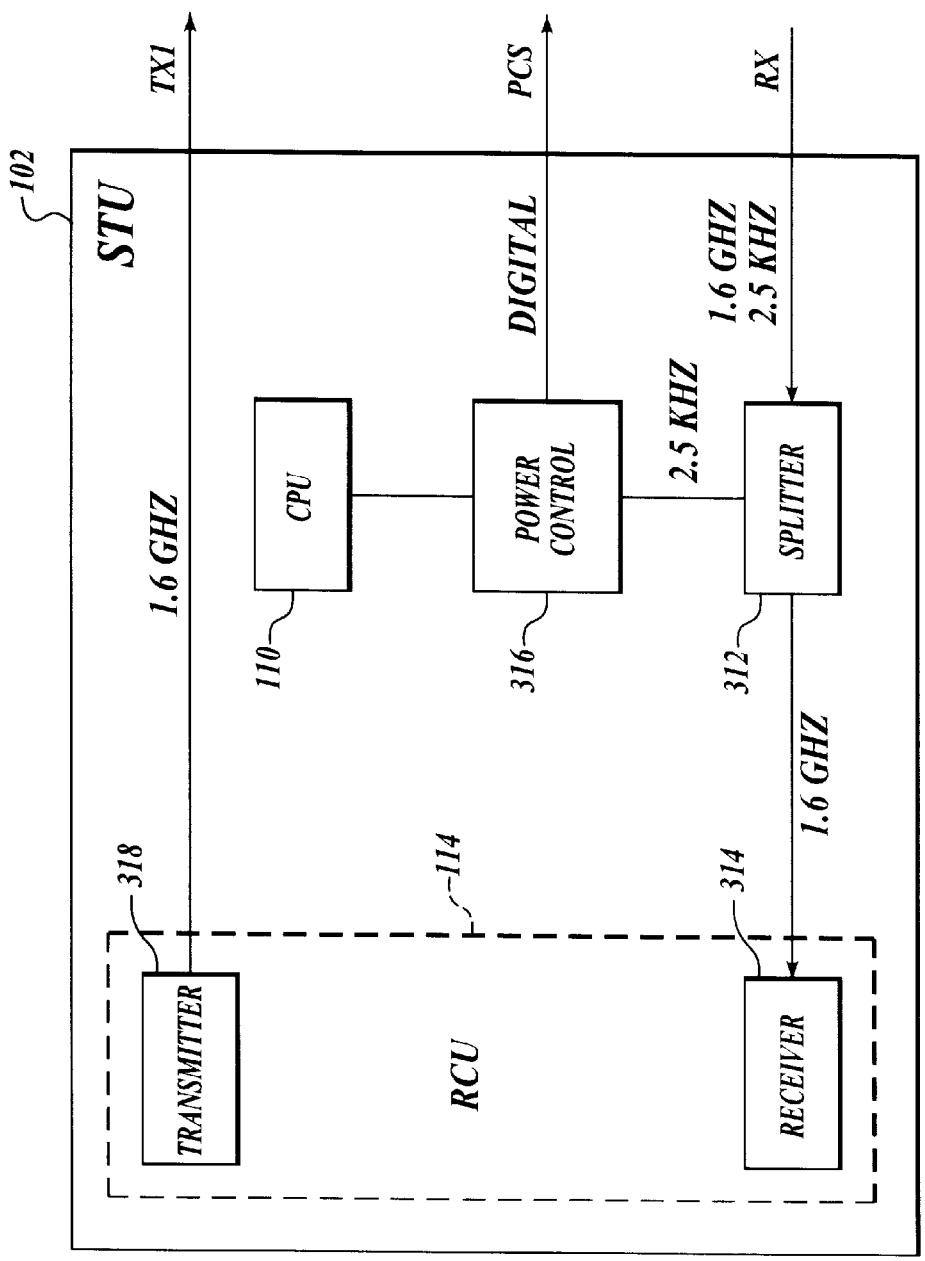
FIG. 3 illustrates the portion of the power control portion of the method and circuit of the invention as implemented in a satellite communication system.

FIG. 3 illustrates the power, or gain, control portion of the method and circuit of the invention as implemented in a satellite communications system. In FIG. 3, the output of diplexer low noise amplifier 106 is received on a single receiver cable RX at a signal splitter circuit 312. Signal splitter circuit 312 divides the combined signal on receiver cable RX into its component parts: the RF signal received from the satellite constellation and frequency signal F. The RF portion of the received signal is output to the radio system transmission signal source, one or more of the individual radio channel units 114, shown in FIG. 1. A system receiver 314 within individual radio channel unit 114 receives the RF portion of the received signal. The frequency signal F portion is output to a power control circuit 316. Splitter circuit 312 receives the combined frequency signal F and the received RF signal summed in summing circuit 224 and transmitted from diplexer low noise amplifier 106 via receiver cable RX. Splitter circuit 312 filters the combined signal using standard high pass and low pass filtering techniques to separate the received 1.6 GHz RF signal and the lower 1 to 5 kHz frequency signal F. The received 1.6 GHz RF signal is output to radio system receiver 314, and the 1 to 5 kHz frequency signal F is sent to power control circuit 316.

Power controller 316 receives frequency signal F and converts it to digital form. In an embodiment where frequency signal F is an analog sine wave, power controller 316 uses a well-known method such as zero-crossing timer to convert analog frequency signal F to a digital number representing the frequency. In an embodiment where frequency signal F is a digital signal, power controller 316 demodulates frequency signal F to convert to baseband digital.

Power controller 316 includes a mechanism that determines the RF power output by the one or more radio system transmitters 318. According to one embodiment, power controller 316 receives transmit power information from each transmitter 318, preferably in digital form. According to another embodiment, power controller 316 detects the power level of the transmitted 1.6 GHz signal by tapping into the TX1 transmission line and applying the signal to an RF power detector. Power controller 316 receives the power level of each transmitter 318 as an input, compares the output power level measured at detector 212 of diplexer low noise amplifier 106 to a predetermined power level, and generates a power control signal "PCS" containing gain compensation commands.

As described above, central processing unit 110 performs the actual transmit power control calculations; therefore, central processing unit 110 contains the transmit power level of each radio channel unit 114. According to an alternative embodiment, central processing unit 110 learns the digital word corresponding to frequency signal F. For example, either power controller 316 transmits the digital word to central processing unit 110, or central processing unit 110 retrieves the digital word from power controller 316. Central processing unit 110 compares the transmit power level of radio channel unit 114 with either the power level detected at diplexer low noise amplifier 106, or the actual power level detected at antenna 108. Central processing unit 110 calculates a compensation signal and send the compensation signal to power control unit 316. Power controller 316 receives the compensation signal as an input and responsively generates a power control signal "PCS" containing gain compensation commands.

Power controller 316 sends power control signal PCS containing gain compensation commands to high power amplifier 104 to bring output power level at diplexer low noise amplifier 106 closer to the predetermined power level. Power controller 316 sends commands to high power amplifier 104 in serial digital form over a dedicated "PCS" line. Alternatively, power controller 316 sends commands to high power amplifier 104 over the TX1 transmission line, using techniques similar to those used to send frequency signals F over the RX receiver line, as described in detail above. Thus, power control signal PCS is carried on radio system transmission line TX1 along with a RF transmission signal, without corrupting or distorting the information in the RF transmission signal. The system power amplifier, high power amplifier 104, is designed to dynamically adjust the transmission power, or gain, in response to received power control signal PCS.

Although the automatic gain compensation circuit of the invention is described herein in combination with the radio system low noise amplifier, diplexer low noise amplifier 106, the invention is alternatively configured in a separate circuit. The automatic gain compensation circuit of the invention effectively compensates for variations in cable losses when the circuit determines the signal power level at the radio system antenna, transmits a signal representative of the signal power level at the radio system antenna a power control circuit 316 using the preexisting radio system receiver cable, compares the power at the radio system antenna with the power level of the transmitted signal at the signal source, and generates a power control signal that is transmitted to the radio system power amplifier, high power amplifier 104, whereby the signal power level is adjusted upwardly or downwardly to compensate for power losses in the transmission cables. Therefore, the automatic gain compensation circuit of the invention is effective when configured separately from diplexer low noise amplifier 106. The automatic gain compensation circuit of the invention need only be coupled to detect a signal indicative of the actual signal power level received at antenna 108 and coupled to transmit a signal indicative of the actual power level via the radio system receiver line coupling the antenna to the signal source. Such a configuration of the automatic gain compensation circuit of the invention is within the contemplation and scope of the present invention.

Furthermore, in the embodiment described in the FIGURES, the detector portion of the automatic gain compensation circuit is coupled to the transmit/receive line RX/TX coupling diplexer low noise amplifier 106 to antenna 108, whereby a signal power level representative of the actual power at the antenna is detected. According to the embodiments of the FIGURES, the power loss between diplexer low noise amplifier 106 and antenna 108 is a fixed and known quantity such that the power level detected at diplexer low noise amplifier 106 sufficiently represents the actual output power level at antenna 108 to effectuate the automatic gain compensation circuit of the invention. Alternatively, the output power level of antenna 108 is measured directly at antenna 108, whereby the actual output power level is known directly and the constant loss across transmit/receive line RX/TX need not be considered. Such a configuration of the automatic gain compensation circuit of the invention is within the contemplation and scope of the present invention.

Thus, the method and circuit of the present invention provide automatic gain compensation in the form of a feedback loop for determining the power level difference between the system signal source and the system antenna, and dynamically adjusting the output power at the system antenna in response to a command from the system control circuit. The gain compensation signals are transmitted within the radio system over the system transmit and receive cables simultaneously with the transmitted and received RF signals. When implemented in a satellite communication system, the present invention provides a method and circuit for dynamically adjusting the system output power in response to a command from satellite telecommunication unit 102 by dynamically adjusting the power gain of high power amplifier 104. Such a configuration of the automatic gain compensation circuit of the invention is within the contemplation and scope of the present invention.

While the preferred embodiment of the invention has been illustrated and described, it will be appreciated that various changes can be made therein without departing from the spirit and scope of the invention. For example, those of ordinary skill in the art will recognize that detector 212 of diplexer low noise amplifier 106 is configurable in many different conventional circuits within the design ability of those of ordinary skill in the art. In another example, detector 212 portion of the invention is equivalently practiced in a circuit separate from but coupled to diplexer low noise amplifier 106. In another example, detector 212 is coupled to directly detect the output power level at the radio system antenna.

What is claimed is:

1. An automatic gain compensation circuit for a radio transmission and reception system comprising:
   a circuit coupled to receive a transmission signal generated by a radio system transmitter represenative of the of the radio system output power at the radio system antenna, said circuit generating an output power signal the frequency of which is correlated to the transmission signal output power, summing said generated output power signal and a radio frequency signal received by the radio system into a combined signal and transmitting said combined signal on the radio system receiver line; and
   a power control circuit coupled to receive said signal, said power control circuit generating a power control signal and transmitting said power control signal to the radio system high power amplifier;
   a radio system transmitter generating a L-band frequency signal;
   a radio system high power amplifier coupled to said transmitter by a first transmitter cable, said high power amplifier dynamically increasing and decreasing the power of said L-band radio frequency signal in response to said power control signal;
   said circuit coupled to receive a transmission signal generated by a radio system further comprises a diplexer coupled to said high power amplifier by a second transmit cable, said diplexer detecting the power level of said L-band radio frequency signal;
   a radio system radio frequency antenna coupled to said diplexer to receive said radio system generated L-band radio frequency signal and transmit a radio frequency transmission signal originating outside of the radio system and outputting said received radio frequency signal;
   a radio system low noise amplifier coupled to said antenna to receive said received radio frequency signal, said low noise amplifier amplifying said received radio frequency signal;
   a signal summer coupled to said diplexer to receive said output signal and coupled to said low noise amplifier to receive said received radio frequency signal, said signal summer summing said output power signal and said received radio frequency signal into a combined signal and outputting said combined signal; and
   said power control circuit further comprising;
   a) a signal splitter coupled to said low noise amplifier by a receiver cable to receive said combined signal, said signal splitter dividing said combined signal into said output power signal and said received radio frequency signal and outputting said signals; and
   a power control signal generator coupled to said signal splitter to receive said output power signal and generation a variable power control signal responsive to said output power signal, said power control signal generator coupled to transmit said variable power control signal to said high power amplifier.

2. The circuit recited in claim 1, further comprising a receiver coupled to said signal splitter for receiving said received radio frequency signal.

3. The circuit recited in claim 1, wherein said output power signal is a digital signal transmitted at a frequency different from the radio system transmission signal frequency, said digital further comprising a frequency modulated signal with digital information representative of the transmission signal output power contained in the modulation.

4. The circuit recited in claim 1, wherein said output power signal further comprises a sinusoidal signal with a frequency proportional to the magnitude of transmission signal output power and a frequency range different from the radio system transmission signal frequency.

5. An automatic gain compensation circuit for a radio frequency transmission and reception system and transmitting gain compensation signals on the radio system preexisting cable system, the automatic gain compensation circuit comprising:
   a radio frequency power level detector coupled to detect the power level in a radio frequency signal generated by a radio system, said detector generating a voltage signal corresponding to the transmission signal output power;
   a converter coupled to receive said voltage signal and converting said voltage signal into a frequency signal corresponding to said output voltage signal;
   an signal summer coupled to receive said corresponding frequency signal and a radio frequency signal received by the radio system, said signal summer combining said corresponding frequency signal with the received radio frequency signal into a combined signal for transmission on the radio system receiver cable;
   a signal splitter coupled to the radio system receiver cable to receive said combined signal, said signal splitter having as a first output said corresponding frequency signal and having as a second output the received radio frequency signal; and a power controller coupled to receive said first output of said signal splitter, said power controller generating a power control signal and coupled to output said power control signal to the radio system signal amplifier.

6. The automatic gain compensation circuit recited in claim 5, wherein said corresponding frequency signal is generated having a frequency different from the frequency the received radio frequency signal.

7. The automatic gain compensation circuit recited in claim 6, wherein the radio frequency transmission and reception system is adapted to transmit and receive radio frequency signals in the L-band; and said corresponding frequency signal further comprises a frequency modulated digital signal having digital information representative of the transmission signal output power contained in the modulation, said digital signal generated having a frequency in the range of 1 kHz to 5 kHz.

8. The automatic gain compensation circuit recited in claim 6, wherein the radio frequency transmission and reception system is adapted to transmit and receive radio frequency signals in the L-band; and said corresponding frequency signal further comprises a sinusoidal signal with a frequency proportional to the magnitude of the transmission signal output power and a frequency in the range of 1 kHz to 5 kHz.

9. A radio transmission and reception system having automatic gain compensation and coupled to an antenna adapted to transmit and receive radio frequency transmissions, the radio system comprising:

a radio frequency signal generator;

a variable output power high power amplifier coupled to said radio frequency signal generator by a first transmitter cable and responsive to a power control signal;

a diplexer low noise amplifier coupled to said high power amplifier by a second transmitter cable and coupled to the antenna, said low noise amplifier further comprising:
   a) a radio frequency power level detector coupled to detect the power level of a radio frequency signal generated by said radio frequency signal generator and having a voltage output proportional to said radio frequency signal power level,
   b) a voltage-to-frequency signal converter coupled to receive said voltage output, and
   c) a signal summing circuit coupled to each of said voltage-to-frequency signal converter and the antenna;

a signal splitter coupled to said low noise amplifier by a receiver cable to receive the output of said signal summing circuit and having as a first output said frequency signal; and a power control signal generator coupled to said signal splitter to receive said first output and coupled to said variable high power amplifier to control amplification variation.

10. The radio system recited in claim 9, wherein said signal splitter has a second output that is an externally originating radio frequency signal received at the antenna; and further comprising a receiver coupled to receive said second output of said signal splitter.

11. The radio system recited in claim 10, wherein said frequency signal is generated having a frequency different from the frequency of an externally originating radio frequency signal received at the antenna.

12. The radio system recited in claim 11, further comprising an antenna adapted to transmit and receive radio frequency transmissions, said antenna coupled by a receiver/transmitter cable to said diplexer low noise amplifier.

13. The radio system recited in claim 12, wherein said antenna is adapted to receive externally generated radio frequency signals in the L-band.

14. The radio system recited in claim 13, wherein said frequency signal further comprises a frequency modulated digital signal having digital information representative of the transmission signal output power contained in the modulation, said digital signal generated in a frequency range different from the L-band frequency.

15. The radio system recited in claim 13, wherein said frequency signal further comprises a sinusoidal signal with a frequency proportional to the magnitude of the transmission signal output power, said sinusoidal signal generated in a frequency range different from the L-band frequency.

16. A method for transmitting and receiving a radio frequency signal, including using cabling preexisting within a radio system for automatically controlling the gain of a radio frequency transmission signal, the method comprising:

generating a radio frequency transmission signal;

communicating said transmission signal to a radio frequency amplifier via a first transmission cable;

variably amplifying said transmission signal;

communicating said amplified transmission signal to a diplexer low power amplifier via a second transmission cable;

detecting a radio frequency power level of said transmission signal indicative of an output power level at a radio system antenna;

communicating said radio frequency power level to a power control circuit via preexisting receiver cabling within the radio system; and controlling said variable amplifying of said transmission signal.

17. The method recited in claim 16, wherein:

said detecting a radio frequency power level of said transmission signal further comprises generating a signal indicative of said detected radio frequency power level; and said controlling said variable amplifying of said transmission signal further comprises communicating said radio frequency power level signal to said radio frequency amplifier.

18. The method recited in claim 17, wherein said communicating said radio frequency power level signal to said power control circuit further comprises combining said radio frequency power level signal with a received radio frequency signal and communicating said combined signal via said preexisting receiver cabling within the radio system.

19. The method recited in claim 18, wherein:

said communicating said radio frequency power level signal to said power control circuit further comprises splitting said radio frequency power level signal from the received radio frequency signal and forming a power control signal representative of said radio frequency power level; and said controlling said variably amplifying of said transmission signal further comprises variably amplifying said transmission signal responsively to said power control signal.

20. The method recited in claim 19, wherein said forming a power control signal representative of said radio frequency power level further comprises comparing said radio frequency power level signal to a radio frequency power level of said generated radio frequency transmission signal.

21. The method recited in claim 20, wherein said communicating said radio frequency power level signal to said radio frequency amplifier further comprises communicating said radio frequency power level signal to said radio frequency amplifier via said first transmission cable.

22. The method recited in claim 20, wherein said communicating said radio frequency power level signal to said radio frequency amplifier further comprises communicating said radio frequency power level signal to said radio frequency amplifier via a coupling different from said first transmission cable.

23. The method recited in claim 17, wherein said generating a signal indicative of said detected radio frequency power level further comprises generating a signal proportional to the radio frequency power level of said transmission signal.

24. The method recited in claim 23, wherein said generating a signal indicative of said detected radio frequency power level further comprises generating a voltage signal proportional to the radio frequency power level of said transmission signal.

25. The method recited in claim 24, wherein said generating a signal indicative of said detected radio frequency power level further comprises generating a frequency modulated digital signal having digital information contained in the modulation describing the radio frequency power level of said transmission signal.

26. The method recited in claim 25, wherein:
said generating a radio frequency transmission signal further comprises generating a radio frequency transmission signal in the L-band; and
said generating a frequency modulated digital signal further comprises generating a frequency modulated digital signal in the range of 1 kHz to 5 kHz.

27. The method recited in claim 24, wherein said generating a signal indicative of said detected radio frequency power level further comprises generating an analog signal with a frequency proportional to said voltage signal.

28. The method recited in claim 24, wherein:
said generating a radio frequency transmission signal further comprises generating a radio frequency transmission signal in the L-band; and
said generating a frequency signal proportional to said voltage signal further comprises generating a frequency signal in the range of 1 kHz to 5 kHz.

* * * * *